US012628318B2

(12) United States Patent  
Jia et al.

(10) Patent No.: US 12,628,318 B2  
(45) Date of Patent: May 12, 2026

---

(54) LIQUID COOLING HEAT DISSIPATION SYSTEM, HEAT DISSIPATION CONTROL METHOD, AND CONTROL CHIP

(71) Applicant: Huawei Technologies Co., Ltd., Shenzhen (CN)

(72) Inventors: Hui Jia, Shenzhen (CN); Junfeng Ding, Shenzhen (CN); Chengjian Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 798 days.

(21) Appl. No.: 17/727,241

(22) Filed: Apr. 22, 2022

(65) Prior Publication Data

US 2022/0248571 A1      Aug. 4, 2022

Related U.S. Application Data

(63) Continuation of application No. PCT/CN2020/093621, filed on May 30, 2020.

(30) Foreign Application Priority Data

Oct. 22, 2019      (CN) .......................... 201911009501.5

(51) Int. Cl.  
*H05K 7/20* (2006.01)

(52) U.S. Cl.  
CPC ..... *H05K 7/20836* (2013.01); *H05K 7/20727* (2013.01); *H05K 7/2079* (2013.01)

(58) Field of Classification Search  
CPC ........... H05K 7/20627; H05K 7/20636; H05K 7/20645; H05K 7/20654; H05K 7/20727;  
(Continued)

(56) References Cited

U.S. PATENT DOCUMENTS 7,315,448 B1 *   1/2008   Bash .................... H05K 7/2079  
                                                      165/80.3  
9,107,327 B2 *   8/2015   Chainer ............. H05K 7/20836  
(Continued)

FOREIGN PATENT DOCUMENTS

CN            102026526 A      4/2011  
CN            202254120 U      5/2012  
(Continued)

OTHER PUBLICATIONS

Drive home et al., "Comparable to 500,000 PCs! A set of GIFs understands Huawei's world's fastest AI training cluster, atlas 900," Sep. 18, 2019, 1 page.  
(Continued)

*Primary Examiner* — Jianying C Atkisson  
*Assistant Examiner* — For K Ling  
(74) *Attorney, Agent, or Firm* — Conley Rose, P.C.

(57)          ABSTRACT

A liquid cooling heat dissipation system includes a control unit, a heat source box, and a heat dissipation unit. A temperature sensing unit is installed in the heat source box, and the temperature sensing unit and the control unit are connected for signal transmission. The heat dissipation unit includes an inlet and an outlet. Coolant flows into the heat dissipation unit through the inlet and flows out of the heat dissipation unit through the outlet. A flow regulating valve is disposed on a pipe at the inlet, and the flow regulating valve and the control unit are connected for signal transmission. The control unit obtains temperature information by using the temperature sensing unit, and determines lowest temperature T1 and highest temperature T2 based on the temperature information. The control unit is configured to control an opening degree of the flow regulating valve.

19 Claims, 11 Drawing Sheets

(58) Field of Classification Search
CPC .......... H05K 7/20763; H05K 7/20772; H05K 7/2079; H05K 7/20836; H05K 7/207
See application file for complete search history.

(56) References Cited

U.S. PATENT DOCUMENTS

| | | | |
|---|---|---|---|
| 2004/0020226 A1 | 2/2004 | Bash et al. | |
| 2008/0232064 A1* | 9/2008 | Sato ................... | H05K 7/20754 361/679.49 |
| 2008/0310112 A1* | 12/2008 | Long .................... | H05K 5/0213 62/132 |
| 2010/0236772 A1* | 9/2010 | Novotny ........... | H05K 7/20836 165/287 |
| 2011/0060470 A1* | 3/2011 | Campbell .......... | G05D 23/1934 700/282 |
| 2011/0240281 A1* | 10/2011 | Avery ................ | H05K 7/20836 62/476 |
| 2013/0098597 A1* | 4/2013 | Fujimoto ................. | F24F 11/30 165/287 |
| 2013/0138253 A1* | 5/2013 | Chainer ............ | H05K 7/20781 700/282 |
| 2013/0264045 A1* | 10/2013 | Chainer .................. | G06F 1/206 165/104.33 |
| 2015/0184665 A1 | 7/2015 | Yamato et al. | |
| 2015/0250077 A1* | 9/2015 | Endo .................. | H05K 7/20745 361/679.47 |
| 2015/0354851 A1* | 12/2015 | Yoshii ...................... | F24F 11/85 165/219 |
| 2016/0007506 A1 | 1/2016 | Karasawa et al. | |
| 2016/0353614 A1* | 12/2016 | Yokohata ............. | H05K 7/2079 |
| 2017/0127573 A1* | 5/2017 | Hirai .................. | H05K 7/20809 |
| 2017/0135250 A1* | 5/2017 | Inano ................. | H05K 7/20745 |
| 2017/0295677 A1 | 10/2017 | Shelnutt et al. | |
| 2019/0343026 A1 | 11/2019 | Zhao et al. | |

FOREIGN PATENT DOCUMENTS

| | | | |
|---|---|---|---|
| CN | 102544618 A | 7/2012 | |
| CN | 102566605 A | 7/2012 | |
| CN | 103115514 A | 5/2013 | |
| CN | 103208665 A | 7/2013 | |
| CN | 103292448 A | 9/2013 | |
| CN | 103307676 A | 9/2013 | |
| CN | 204044700 U | 12/2014 | |
| CN | 104457068 A | 3/2015 | |
| CN | 104566835 A | 4/2015 | |
| CN | 104755765 A | 7/2015 | |
| CN | 104822242 A | 8/2015 | |
| CN | 105283035 A | 1/2016 | |
| CN | 205123602 U | 3/2016 | |
| CN | 205196226 U | 4/2016 | |
| CN | 105704990 A | 6/2016 | |
| CN | 105783195 A | 7/2016 | |
| CN | 106163242 A | 11/2016 | |
| CN | 106411153 A | 2/2017 | |
| CN | 206282947 U | 6/2017 | |
| CN | 106941311 A | 7/2017 | |
| CN | 107612358 A | 1/2018 | |
| CN | 107940698 A | 4/2018 | |
| CN | 108106032 A | 6/2018 | |
| CN | 108738279 A | 11/2018 | |
| CN | 109037845 A | 12/2018 | |
| CN | 208515373 U | 2/2019 | |
| CN | 109713399 A | 5/2019 | |
| CN | 109769381 A | 5/2019 | |
| CN | 109948986 A | 6/2019 | |
| CN | 209029753 U | 6/2019 | |
| CN | 109959110 A | 7/2019 | |
| CN | 109980312 A | 7/2019 | |
| CN | 110207325 A | 9/2019 | |
| CN | 209345485 U | 9/2019 | |
| EP | 1217879 A2 * | 6/2002 | ............ H05K 7/207 |
| IN | 107295779 A | 10/2017 | |
| JP | H07218075 A | 8/1995 | |
| JP | 2014090102 A | 5/2014 | |
| KR | 101939802 B1 | 4/2019 | |

OTHER PUBLICATIONS

NetEase Technology Report et al., "How fast is the Atlas900 huawei AI training cluster? The hash rate is equivalent to 500,000 PCs," Sep. 18, 2019, 2 pages.

* cited by examiner

Step 501: Obtain temperature information

Step 502: Control an opening degree of a proportional solenoid valve based on the temperature information

1

LIQUID COOLING HEAT DISSIPATION SYSTEM, HEAT DISSIPATION CONTROL METHOD, AND CONTROL CHIP

CROSS-REFERENCE TO RELATED APPLICATIONS

This is a continuation of International Patent Application No. PCT/CN2020/093621 filed on May 30, 2020, which claims priority to Chinese Patent Application No. 201911009501.5 filed on Oct. 22, 2019. The disclosures of the aforementioned applications are hereby incorporated by reference in their entireties.

TECHNICAL FIELD

This application relates to the field of cooling technologies, and in particular, to a liquid cooling heat dissipation system, a heat dissipation control method, and a control chip that are used in a communication device.

BACKGROUND

An air/liquid heat exchanger is widely used to resolve a heat dissipation problem of a communication device. A common scenario is to dissipate heat for a server cabinet. Generally, an air/liquid heat exchanger is disposed in a cabinet or beside the cabinet. Coolant flows into the air/liquid heat exchanger, and the air/liquid heat exchanger is in a low-temperature environment. Cold air in the low-temperature environment is blown to the cabinet by a fan, to dissipate heat for a board in the cabinet. However, when the air/liquid heat exchanger is used to dissipate heat for the cabinet, how to avoid condensation in the cabinet is a problem that needs to be considered with a high priority during design of a heat dissipation system. When temperature of incoming water in the air/liquid heat exchanger is low, for example, the temperature of the incoming water is 7° C. to 12° C., exhaust air blown into the cabinet may be only 15° C., but a dew point of the cabinet in this case may be near 20° C. The dew point, also referred to as dew point temperature, is generally marked as Td, and is temperature at which air is cooled to saturation when vapor content in the air is constant and atmospheric pressure is constant, that is, temperature at which vapor in the air is liquefied to form a water droplet. Therefore, when air at 15° C. is blown to the cabinet, temperature of some areas in the cabinet is lower than the dew point, and water droplets are formed in the cabinet. Consequently, a short-circuit fault on a board may be caused.

To resolve a problem of condensation in the cabinet, in a conventional technology, generally, temperature of incoming water in the air/liquid heat exchanger is directly controlled to be greater than dew point temperature of an environment in which a device for which heat is to be dissipated is located, to avoid or reduce a condensation phenomenon. For example, there are the following two solutions.

One solution is to control the temperature of the incoming water in the air/liquid heat exchanger by using a cooling tower. The cooling tower controls the temperature of the incoming water in the air/liquid heat exchanger by adjusting a bypass valve and a fan speed of the cooling tower, as shown in FIG. 1. In specific implementation, a temperature sensor detects temperature of output water of the cooling tower and controls the temperature of the output water of the cooling tower to be greater than dew point temperature in an equipment cabinet. When the temperature of the output water is lower than the dew point temperature, the fan speed of the cooling tower is reduced and the bypass valve is turned up to mix the output water with hot water, to increase the temperature of the output water. A disadvantage of this solution is that a chilled water scenario cannot be supported. To be specific, when only output water in a chilled water unit in the cabinet is available (temperature of the output water in the chilled water unit is usually 7° C. to 15° C., but a dew point range in a cabinet environment is 5.5° C. to 24° C.), and the cooling tower or a dry cooler cannot be connected, a condensation phenomenon easily occurs.

The other solution is shown in FIG. 2. A chiller distribution unit (CDU) is added to a heat dissipation system, and temperature of incoming water in the air/liquid heat exchanger is controlled by using the CDU, so that the temperature of the incoming water is greater than a dew point of the cabinet. The CDU includes key components such as a plate heat exchanger and a pump, and is mainly used to control temperature of output water and provide fluid circulation power. A specific temperature control method is as follows: A temperature sensor monitors temperature of output water of the CDU. When the water temperature is lower than a target value, an opening degree of a bypass valve for fluid on the other side of the plate heat exchanger in the CDU is increased, so that fewer cooling mediums enter the plate heat exchanger. When the water temperature is greater than the target value, the bypass valve is turned down. Water on the other side of the CDU may be from a chilled water unit, or may be from a cooling tower, a dry cooler, or the like. The CDU serves as an additional temperature control device. Disadvantages of this solution are as follows: Costs are increased because a single set of CDU system is introduced, and when the CDU and an equipment cabinet are not in a same equipment room, dew point temperature in the equipment cabinet needs to be known in advance to perform temperature control, and consequently, it is inconvenient to perform control.

How to expand a water temperature range supported by an air/liquid heat exchanger in a liquid cooling heat dissipation system to be compatible with a chilled water scenario in the equipment room and how to reduce costs of the liquid cooling heat dissipation system are technical problems to be resolved in this application.

SUMMARY

In view of this, this application provides a liquid cooling heat dissipation system and a liquid cooling heat dissipation method, so that more coolant temperature ranges can be supported. In a chilled water scenario, heat dissipation may also be provided for an equipment cabinet, and it is easy to implement engineering.

The foregoing objectives are to be achieved by features in the independent claims, and other objectives are to be achieved by the features in the independent claims. Further implementations are reflected in the dependent claims, the specification, and the accompanying drawings.

According to a first aspect, a liquid cooling heat dissipation system is provided and includes a control unit, a heat source box, and a heat dissipation unit. At least one temperature sensing unit is installed in the heat source box, and the at least one temperature sensing unit and the control unit are connected for signal transmission. The heat dissipation unit includes an inlet and an outlet. Coolant flows into the heat dissipation unit through the inlet and flows out of the heat dissipation unit through the outlet. A flow regulating valve is disposed on a pipe at the inlet, and the flow regulating valve and the control unit are connected for signal transmission. The control unit is configured to obtain temperature information by using the at least one temperature sensing unit, and determine lowest temperature T1 and highest temperature T2 based on the temperature information, where the lowest temperature T1 is a smallest value in at least one temperature value obtained by the at least one temperature sensing unit, and the highest temperature T2 is a greatest value in the at least one temperature value obtained by the at least one temperature sensing unit. The control unit controls an opening degree of the flow regulating valve based on the lowest temperature T1, the highest temperature T2, and a temperature control parameter and/or a dew point temperature value Td.

In the liquid cooling heat dissipation system, a flow of coolant flowing to an air/liquid heat exchanger can be controlled based on a temperature value in an equipment cabinet, a condensation phenomenon can be avoided or reduced by adjusting temperature of a cold air flow blown to the equipment cabinet. In the liquid cooling heat dissipation system, temperature of the coolant does not need to be controlled in advance. When the temperature of the coolant is relatively low and the temperature of the coolant is not adjustable, the liquid cooling heat dissipation system is also applicable to heat dissipation of an equipment cabinet, and therefore is more compatible.

Based on the first aspect, in a first possible implementation of the liquid cooling heat dissipation system, the temperature control parameter includes a normal-temperature threshold T3 and a high-temperature threshold T4.

Based on the first aspect or the first possible implementation of the first aspect, in a second possible implementation of the liquid cooling heat dissipation system, at least one humidity sensing unit is further installed in the heat source box, the at least one humidity sensing unit and the control unit are connected for signal transmission, and the control unit is further configured to obtain humidity information by using the at least one humidity sensing unit.

A more accurate control parameter can be provided for the control unit by monitoring a humidity value in the equipment cabinet, so that the liquid cooling heat dissipation system can have more accurate control precision, and the condensation phenomenon is more stably avoided or reduced.

Based on the second possible implementation of the first aspect, in a third possible implementation of the liquid cooling heat dissipation system, the control unit is further configured to: determine highest humidity RH based on humidity information, where the highest humidity RH is a greatest value in at least one humidity value obtained by the at least one humidity sensing unit, and the control unit controls the opening degree of the flow regulating valve based on the lowest temperature T1, the highest temperature T2, the highest humidity RH, the temperature control parameter and/or the dew point temperature value Td, and a humidity control parameter.

Based on the third possible implementation of the first aspect, in a fourth possible implementation of the liquid cooling heat dissipation system, the humidity control parameter includes a normal-humidity threshold RH1 and/or a high-humidity threshold RH2.

Based on the first aspect or any implementation of the first aspect, in a fifth possible implementation of the liquid cooling heat dissipation system, the flow regulating valve is a proportional solenoid valve.

The proportional solenoid valve is used to control a flow rate or a flow amount of the coolant. The proportional solenoid valve can match with the control unit, receive signal control, and can more accurately control the flow rate or the flow amount in response to different control signals.

Based on the first aspect or any implementation of the first aspect, in a sixth possible implementation of the liquid cooling heat dissipation system, the dew point temperature value Td is a preset value prestored in the control unit, or is collected by using an external dew point collecting unit, or is an adjustable parameter value.

According to a second aspect, a heat dissipation control method for a liquid cooling heat dissipation system is provided, and includes: obtaining temperature information of different locations in a heat source box by using at least one temperature sensing unit; determining lowest temperature T1 and highest temperature T2 based on the temperature information, where the lowest temperature T1 is a smallest value in at least one temperature value obtained by the at least one temperature sensing unit, and the highest temperature T2 is a greatest value in the at least one temperature value obtained by the at least one temperature sensing unit; obtaining a temperature control parameter; and controlling an opening degree of a flow regulating valve in the liquid cooling heat dissipation system based on the lowest temperature T1, the highest temperature T2, and the temperature control parameter.

Based on the heat dissipation control method for the liquid cooling heat dissipation system, a maximum temperature value and a minimum temperature value are separately calculated for a plurality of monitored temperature values. Whether temperature is excessively high is determined based on the maximum temperature value, and a corresponding control action is performed, to avoid a high-temperature case; and whether the minimum temperature value is close to dew point temperature is determined based on the minimum temperature value, and a corresponding control action is performed, to avoid or reduce the condensation phenomenon. Through brief control logic, the heat dissipation control method can be used to stably dissipate heat for the equipment cabinet. Therefore, the condensation phenomenon can be avoided, and high temperature in the cabinet can also be prevented.

Based on the second aspect, in a first possible implementation of the heat dissipation control method, the temperature control parameter includes a normal-temperature threshold T3 and a high-temperature threshold T4.

Based on the first possible implementation of the second aspect, in a second possible implementation of the heat dissipation control method, the controlling an opening degree of a flow regulating valve in the liquid cooling heat dissipation system based on the lowest temperature T1, the highest temperature T2, and the temperature control parameter includes: when T1≤T3, controlling the flow regulating valve to decrease the opening degree; or when T2>T4, controlling the flow regulating valve to increase the opening degree.

In the foregoing control method, lowest temperature in the cabinet can be controlled to be greater than the normal-temperature threshold, and highest temperature in the cabinet can be controlled to be lower than the high-temperature threshold. A control operation is simple, and the control method is applicable to stable heat dissipation for the equipment cabinet. Therefore, the condensation phenomenon can be avoided, and high temperature in the cabinet can also be prevented.

Based on the first or second possible implementation of the second aspect, in a third possible implementation of the heat dissipation control method, the controlling an opening degree of a flow regulating valve in the liquid cooling heat dissipation system based on the lowest temperature T1, the highest temperature T2, and the temperature control parameter includes: when T1>T3 and T2≤T4, controlling the flow regulating valve to keep the current opening degree.

When a temperature range of the cabinet is between the normal-temperature threshold and the high-temperature threshold, no dew appears in the cabinet, and the temperature in the cabinet is not high and does not affect a working status of a communication device. Therefore, the flow regulating valve is controlled to keep the current opening degree.

Based on the first possible implementation of the second aspect, in a fourth possible implementation of the heat dissipation control method, the temperature control parameter further includes a dew point temperature value Td, and the controlling an opening degree of a flow regulating valve in the liquid cooling heat dissipation system based on the lowest temperature T1, the highest temperature T2, and the temperature control parameter includes: when T1≤Td+N, controlling the flow regulating valve to decrease the opening degree, where N is a preset value; or when T2>T4, controlling the flow regulating valve to increase the opening degree.

In the foregoing control method, lowest temperature in the cabinet can be controlled to be greater than the dew point temperature, and highest temperature in the cabinet can be controlled to be lower than the high-temperature threshold. A control operation is simple, and the control method is applicable to stable heat dissipation for the equipment cabinet. Therefore, the condensation phenomenon can be avoided, and high temperature in the cabinet can also be prevented. In addition, the lowest temperature in the cabinet is controlled by using the dew point temperature as a criterion, so that an adjustment range can be wider, and it is easier to perform control.

Based on the first or fourth possible implementation of the second aspect, in a fifth possible implementation of the heat dissipation control method, the temperature control parameter further includes the dew temperature value Td, and the controlling an opening degree of a flow regulating valve in the liquid cooling heat dissipation system based on the lowest temperature T1, the highest temperature T2, and the temperature control parameter includes: when T1>Td+N and T2≤T4, controlling the flow regulating valve to keep the current opening degree.

When a temperature range of the cabinet is between the normal-temperature threshold and the high-temperature threshold, a current status is a target control status, no dew appears in the cabinet, and the temperature in the cabinet is not high and does not affect a working status of a communication device. Therefore, the flow regulating valve is controlled to keep the current opening degree.

Based on the second aspect or the first possible implementation of the second aspect, in a sixth possible implementation of the heat dissipation control method, the method further includes: obtaining humidity information by using at least one humidity sensing unit.

A more accurate control parameter can be provided for the heat dissipation control method by collecting a humidity value in the equipment cabinet, so that more accurate control precision is achieved, and the condensation phenomenon is more stably avoided or reduced.

Based on the sixth possible implementation of the second aspect, in a seventh possible implementation of the liquid cooling heat dissipation system, highest humidity RH is calculated based on humidity information, where the highest humidity RH is a greatest value in at least one humidity value obtained by the at least one humidity sensing unit, and the opening degree of the flow regulating valve in the liquid cooling heat dissipation system is controlled based on the lowest temperature T1, the highest temperature T2, the highest humidity RH, the temperature control parameter, and a humidity control parameter.

Based on the seventh possible implementation of the second aspect, in an eighth possible implementation of the heat dissipation control method, the humidity control parameter includes a normal-humidity threshold RH1 and/or a high-humidity threshold RH2.

Based on the eighth possible implementation of the second aspect, in a ninth possible implementation of the heat dissipation control method, the controlling the opening degree of the flow regulating valve in the liquid cooling heat dissipation system based on the lowest temperature T1, the highest temperature T2, the highest humidity RH, the temperature control parameter, and a humidity control parameter includes: when T1>T3, T2≤T4, and RH≤RH2, controlling the flow regulating valve to keep the current opening degree; or when T1>T3, T2≤T4, and RH>RH2, controlling the flow regulating valve to decrease the opening degree.

When the temperature range of the cabinet is between the normal-temperature threshold and the high-temperature threshold, humidity in the cabinet is further adjusted. If an air humidity range in the cabinet is not high and does not exceed the high-humidity threshold, current cooling strength is kept. If the humidity is excessively high, the opening degree of the regulating valve is decreased, and the cooling strength is reduced. A corresponding cooling effect is that air temperature in the cabinet rises and humidity drops.

Based on the eighth possible implementation of the second aspect, in a tenth possible implementation of the heat dissipation control method, the controlling the opening degree of the flow regulating valve in the liquid cooling heat dissipation system based on the lowest temperature T1, the highest temperature T2, the highest humidity RH, the temperature control parameter, and a humidity control parameter includes: when T1>T3, T2≤T4, and RH≤RH1, controlling the flow regulating valve to increase the opening degree; when T1>T3, T2≤T4, and RH1<RH≤RH2, controlling the flow regulating valve to keep the current opening degree; or when T1>T3, T2≤T4, and RH>RH2, controlling the flow regulating valve to decrease the opening degree.

When the temperature range of the cabinet is between the normal-temperature threshold and the high-temperature threshold, humidity in the cabinet is further adjusted. If an air humidity in the cabinet is relatively low and is lower than the normal-humidity threshold, cooling strength may be improved. A corresponding cooling effect is that the air humidity in the cabinet rises and temperature drops. If the air humidity in the cabinet is not high and a humidity value is between the normal-humidity threshold and the high-humidity threshold, the current cooling strength is kept. If the humidity is excessively high, the opening degree of the regulating valve is decreased, and the cooling strength is reduced. A corresponding cooling effect is that air temperature in the cabinet rises and humidity drops.

Based on the eighth possible implementation of the second aspect, in an eleventh possible implementation of the heat dissipation control method, the temperature control parameter further includes a dew point temperature value Td. When T1>Td+N, T2≤T3, and RH≤RH2, the flow regulating valve is controlled to keep the current opening degree. When T1>Td+N, T3<T2≤T4, and RH≤RH1, the flow regulating valve is controlled to increase the opening degree. When $T1>Td+N$, $T3<T2\leq T4$, and $RH1<RH\leq RH2$, the flow regulating valve is controlled to keep the current opening degree.

When a temperature range of the cabinet is between the dew point temperature and the normal-temperature threshold, a current status is an ideal control status. No dew appears in the cabinet, and the temperature in the cabinet is relatively low and is beneficial to stable working of a communication device. Therefore, the flow regulating valve can be controlled to keep the current opening degree provided that air humidity in the cabinet is not high.

When the temperature range in the cabinet is between the dew point temperature and the high-temperature threshold, the temperature in the cabinet is moderate. If air humidity in the cabinet is low, cooling strength may be improved, and the temperature in the cabinet may be further reduced. A corresponding operation is to control the flow regulating valve to increase the opening degree. If the air humidity in the cabinet is in a moderate state and a humidity value is between the normal-humidity threshold and the high-humidity threshold, the current cooling strength is kept.

Based on any possible implementation of the second aspect, in a twelfth possible implementation of the heat dissipation control method, the temperature control parameter further includes an alarm temperature threshold T5. When $T2\geq T5$ or $RH\geq RH2$, an alarm signal is sent.

According to a third aspect, a chip system is provided. The chip system includes a processor, a memory, and an interface circuit, the processor, the memory, and the interface circuit are interconnected by using a line, and the memory stores program instructions. When the program instructions are executed by the processor, the heat dissipation control method provided in the second aspect or any implementation of the second aspect is implemented.

According to a fourth aspect, a computer-readable storage medium is provided. A heat dissipation control program of a liquid cooling heat dissipation system is stored in the storage medium, and when the heat dissipation control program of the liquid cooling heat dissipation system is executed by a processor, steps of the heat dissipation control method provided in the second aspect or any implementation of the second aspect are implemented.

According to a fifth aspect, a computer program product including instructions is provided. The program product is used for heat dissipation control of a liquid cooling heat dissipation system, and when the program is executed by a processor, steps of the heat dissipation control method provided in the second aspect or any implementation of the second aspect are implemented.

In the technical solutions provided in this application, an air/liquid heat exchanger in the liquid cooling heat dissipation system can support a larger coolant supply range, so that the air/liquid heat exchanger is compatible with a chilled water scenario in an equipment room, and design and control costs are also reduced.

These aspects and other aspects of this application are more concise and comprehensible in descriptions of the following embodiments.

BRIEF DESCRIPTION OF DRAWINGS

To describe technical solutions in embodiments of this application more clearly, the following briefly describes the accompanying drawings. It is clear that the accompanying drawings in the following description show some embodiments of this application, and a person of ordinary skill in the art may still derive other drawings from these accompanying drawings without creative efforts.

Figures 1, 2:
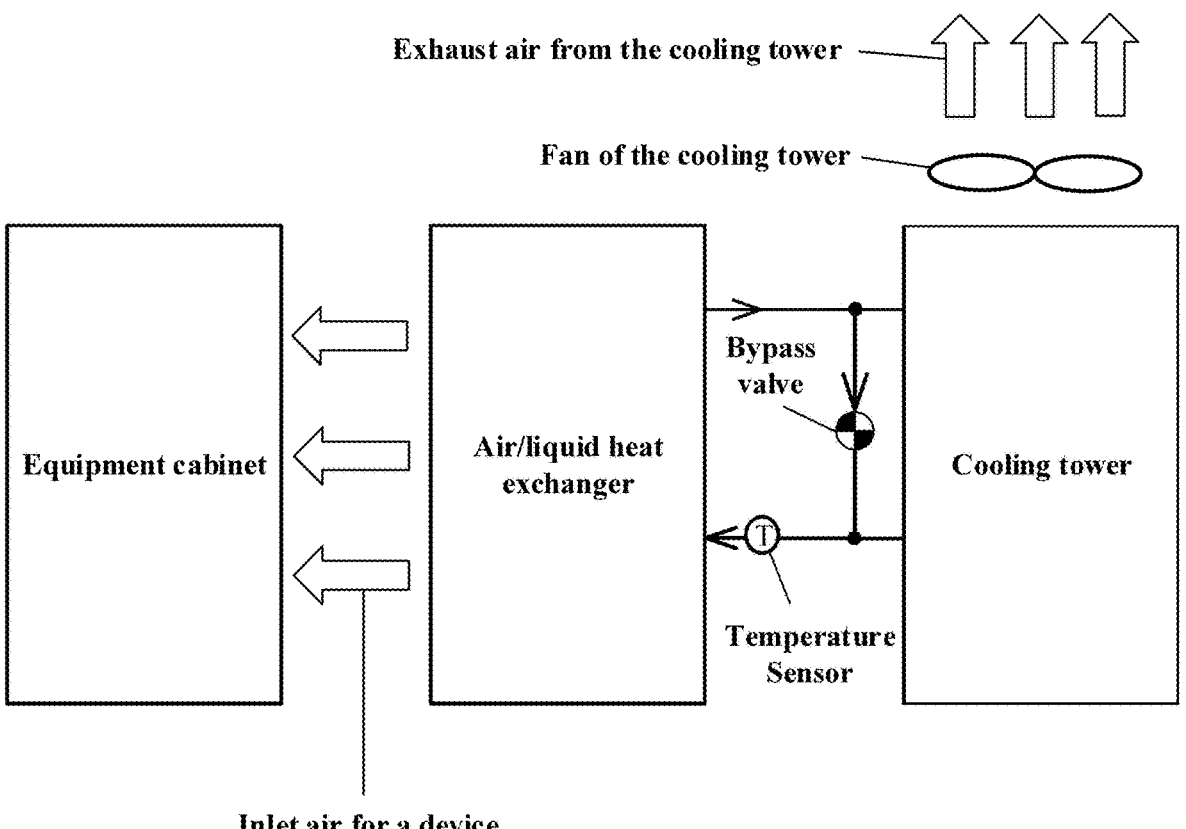
FIG. 1 is a schematic diagram of a structure of a liquid cooling heat dissipation system provided in a conventional technology.
FIG. 2 is a schematic diagram of a structure of another liquid cooling heat dissipation system provided in a conventional technology.

List of reference numerals: 1—Control unit; 2—Side post; 3—Heat source box; 4—Temperature sensing unit and/or humidity sensing unit; 5—Heat dissipation unit; 6—Flow regulating valve; 7—Inlet; and 8—Outlet.

DESCRIPTION OF EMBODIMENTS

To make the objectives, technical solutions, and advantages of embodiments of this application clearer, the following clearly describes the technical solutions in embodiments of this application with reference to the accompanying drawings in embodiments of this application. It is clear that the described embodiments are merely a part rather than all of embodiments of this application. All other embodiments obtained by a person of ordinary skill in the art based on embodiments of this application without creative efforts shall fall within the protection scope of this application.

Figure 3:
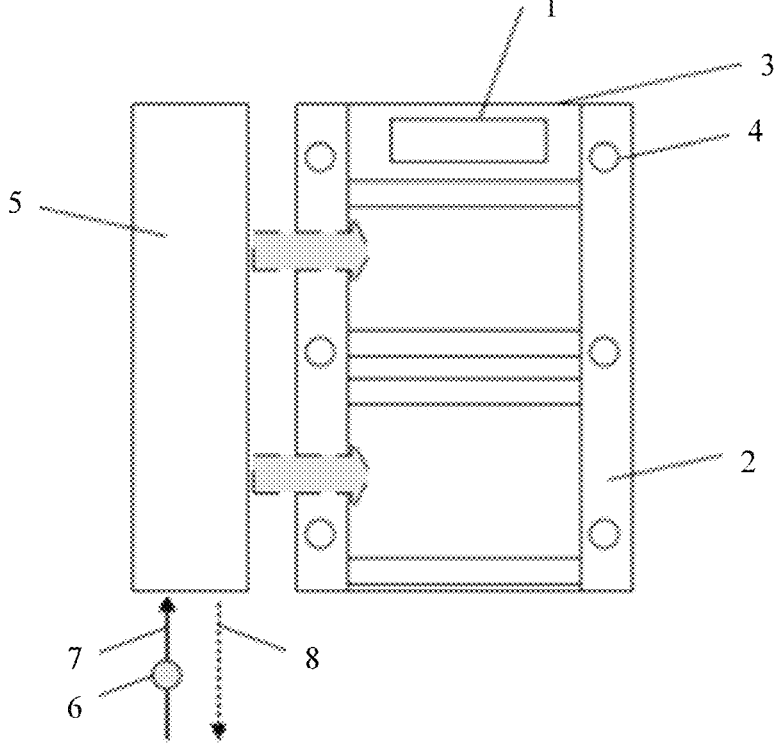
FIG. 3 is a schematic diagram of a structure of a liquid cooling heat dissipation system according to Embodiment 1 of this application.

A liquid cooling heat dissipation system is provided in Embodiment 1 of this application, and may be configured to dissipate heat for a server cabinet. Technical solutions provided in Embodiment 1 of this application are described below with reference to FIG. 3.

Based on Embodiment 1 of this application, the liquid cooling heat dissipation system includes a control unit 1, a heat source box 3, and a heat dissipation unit 5.

Specifically, the heat source box 3 may be an equipment cabinet. If no special description is provided, the equipment cabinet is used as an example of the heat source box 3 for description in this application.

Specifically, the heat dissipation unit 5 may be an air/liquid heat exchanger. If no special description is provided, the air/liquid heat exchanger is used as an example of the heat dissipation unit 5 for description in this application.

The equipment cabinet 3 includes a server board inserted in a guide rail of the cabinet and the control unit 1 disposed on the top inside the cabinet. Side posts 2 used for supporting and fastening are disposed on two ends of the equipment cabinet 3, and six temperature sensing units and/or humidity sensing units 4 are disposed on the side posts 2. Specifically, the temperature sensing unit and/or humidity sensing unit 4 may be a temperature/humidity sensor. If no special description is provided, the temperature/humidity sensor is used as an example of the temperature sensing unit and/or humidity sensing unit for description in this application. The air/liquid heat exchanger 5 is located on one side of the equipment cabinet 3, and a flow regulating valve 6 is installed on a pipe at an inlet of the air/liquid heat exchanger 5. Specifically, the flow regulating valve may be a proportional solenoid valve. If no special description is provided, the proportional solenoid valve is used as an example of the flow regulating valve for description in this application. An inlet 7 and an outlet 8 are respectively an inlet and an outlet of coolant of the air/liquid heat exchanger 5. In addition, exhaust air formed in the air/liquid heat exchanger 5 is blown to an air intake vent of the equipment cabinet 3. It may be understood that, in embodiments of this application, a quantity of temperature/humidity sensors 4 is not limited.

The equipment cabinet 3 is configured to deploy a communication device. Optionally, there is space of 47 U or 52 U (which may be set based on a requirement of a customer) inside the cabinet. 36 U is used to deploy a computing node, and a battery, a switch, and the control unit 1 may be deployed in the other space. The control unit 1 collects signals of the temperature/humidity sensor 4 and the proportional solenoid valve 6, and adjusts the proportional solenoid valve 6 based on a specific algorithm. For example, the proportional solenoid valve 6 works in a voltage range of 2 V to 10 V. The control unit 1 can obtain a current opening degree value of the proportional solenoid valve 6 by collecting a working voltage value signal of the proportional solenoid valve 6. A higher voltage value indicates a higher current opening degree of the proportional solenoid valve 6. When a signal collected by the control unit 1 shows that a voltage value is 2 V, a corresponding current opening degree value of the proportional solenoid valve 6 is 0. When the voltage value is 10 V, the corresponding current opening degree value of the proportional solenoid valve 6 is 100%.

The air/liquid heat exchanger 5 may be built into the equipment cabinet 3, or arranged in parallel with the equipment cabinet 3. A configuration relationship of the air/liquid heat exchanger 5 and the equipment device 3 may be one-to-one, two-to-one, or one-to-multiple, and quantities of the two devices may be correspondingly adjusted based on an actual situation. A function of the air/liquid heat exchanger 5 is to provide cold air required for heat dissipation for the communication device in the equipment cabinet 3. A cold amount of the air/liquid heat exchanger 5 comes from coolant with lower temperature such as water provided by a coolant providing end, to form heat exchange between the air and the coolant.

Optionally, the temperature/humidity sensor 4 is a component that integrates a temperature monitoring function and a humidity monitoring function. It may be understood that the temperature/humidity sensor 4 may be a split-type component; in other words, the temperature/humidity sensor 4 includes a thermometer and a hygrometer. In addition, the temperature/humidity sensor 4 may alternatively have only a temperature monitoring function or only a humidity monitoring function; in other words, the temperature/humidity sensor 4 may be replaced with a thermometer or a hygrometer.

Optionally, positions of temperature/humidity sensors 4 may be distributed at different up, down, left, and right positions inside the cabinet 3, or may be scattered at different positions at the air intake vent of the cabinet.

Optionally, the proportional solenoid valve 6 is an example type of the flow regulating valve, and may be alternatively replaced with another type of flow regulating valve. This is not limited herein. The proportional solenoid valve 6 may choose to control an opening degree according to a proportion, for example, adjust an opening degree value of 0 to 100% based on a control signal, to control a flow amount; or may choose to have a fixed gear, for example, a high gear, a medium gear, or a low gear, or several gears. Different gears have different opening degrees. The flow amount is the largest in the high gear, and the flow amount is the smallest in the low gear.

The temperature/humidity sensor 4 and the proportional solenoid valve 6 may be connected to the control unit 1 in a wired or wireless manner for signal transmission.

Optionally, in the liquid cooling heat dissipation system provided in this embodiment, one or more temperature/humidity sensors 4 or dew point meters may be disposed on an outer side of the equipment cabinet 3, to monitor dew point temperature. The dew point temperature may alternatively be preset to a fixed value in the control unit 1, and is not obtained through monitoring. The dew point temperature may alternatively be specific dew point temperature input or configured through inputting/configuration by a user for the control unit by using an input module.

Optionally, in the liquid cooling heat dissipation system provided in this embodiment, a control panel may be configured, to provide an input port for the user. The user configures a specific control parameter based on a specific environment such as a climate condition and a season by using the control panel and by using an input module of the control unit 1. The control parameter may include a temperature control parameter and/or a humidity control parameter and/or dew point temperature. For details, refer to method embodiments of this application.

Figure 4:
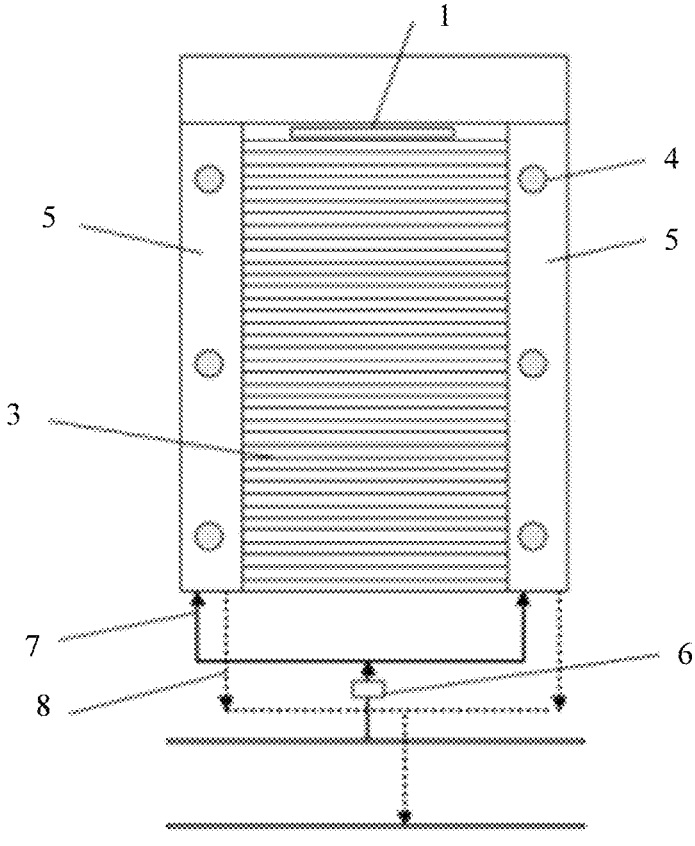
FIG. 4 is a schematic diagram of a structure of a liquid cooling heat dissipation system according to Embodiment 2 of this application.

Another liquid cooling heat dissipation system is provided in Embodiment 2 of this application, as shown in FIG. 4. Based on Embodiment 1, the liquid cooling heat dissipation system includes two air/liquid heat exchangers 5, the two air/liquid heat exchangers 5 are disposed on two sides inside the equipment cabinet 3, and six temperature/humidity sensors 4 are scattered at air outlets of the air/liquid heat exchangers 5. The proportional solenoid valve 6 is disposed on a coolant pipe on an upstream of inlets 7 of the two air/liquid heat exchangers 5. It may be understood that, in embodiments of this application, a quantity of air/liquid heat exchangers 5 and a quantity of temperature/humidity sensors 4 are not limited. Unless otherwise noted, in implementations of this application, six temperature/humidity sensors are used as an example for description.

Based on the liquid cooling heat dissipation system provided in Embodiment 1 or Embodiment 2, the liquid cooling heat dissipation system can support a larger coolant temperature range, and heat dissipation may be provided for an equipment cabinet in a chilled water scenario. In other words, when only output water of a chilled water unit is available during cooling water supply of the equipment cabinet, heat dissipation may also be implemented for the equipment cabinet. For example, when temperature of the coolant is lower than dew point temperature, temperature of cold air blown into the equipment cabinet can be prevented from being excessively low by reducing a flow amount of coolant flowing into the air/liquid heat exchanger, so that a condensation phenomenon is reduced or avoided.

In addition, in the liquid cooling heat dissipation system provided in the foregoing embodiment, the temperature/humidity sensor, the control unit, and the proportional solenoid valve are arranged to adjust the flow amount of the coolant flowing into the air/liquid heat exchanger, to dissipate heat for the equipment cabinet. The liquid cooling heat dissipation system is easy to be implemented in engineering and does not need to be equipped with a complex CDU system. Heat dissipation control can be implemented by using only a simple functional component, and the liquid cooling heat dissipation system has advantages of simplicity and low costs.

Figure 5A:
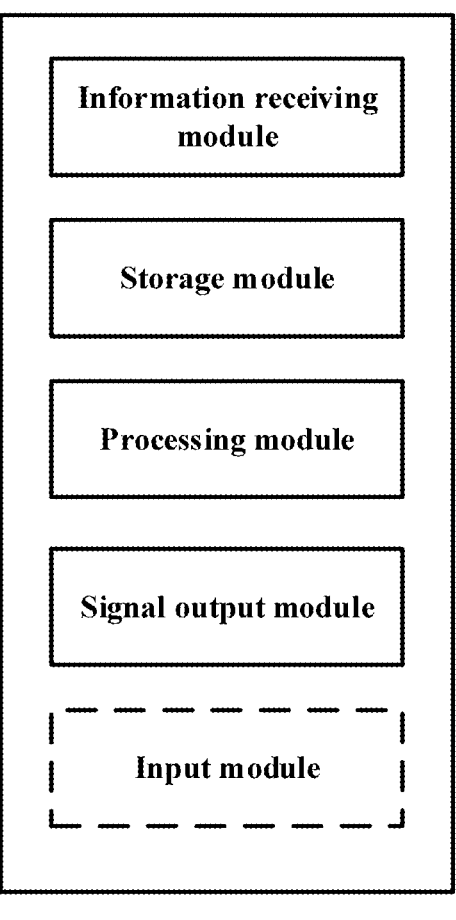
FIG. 5A is a schematic diagram of a structure of a control unit according to Embodiment 3 of this application.

A heat dissipation control method is provided in Embodiment 3 of this application. In the heat dissipation control method provided in this embodiment, in the liquid cooling heat dissipation systems provided in Embodiment 1 and Embodiment 2, the proportional solenoid valve 6 is controlled by using the control unit 1, to dissipate heat for the equipment cabinet 3. As shown in FIG. 5A, the control unit 1 includes an information receiving module, a storage module, a processing module, and a signal output module.

Figure 5B:
FIG. 5B is a flowchart of a heat dissipation control method according to Embodiment 3 of this application.

Specific steps of Embodiment 3 of this application are shown in FIG. 5B, and include the following steps.

Step 501: The control unit 1 obtains temperature information. The temperature information is obtained by using a plurality of temperature/humidity sensors 4, and includes a plurality of temperature values. The information receiving module in the control unit 1 is configured to receive the temperature information obtained by the temperature/humidity sensors 4.

A specific manner in which the control unit 1 obtains the temperature information may be: periodically collecting temperature information monitored by the temperature/humidity sensors 4; receiving the monitored temperature information periodically sent by the temperature/humidity sensors 4; or receiving monitored temperature information sent by the temperature/humidity sensors 4 via triggering based on an event, for example, when the temperature information monitored by the temperature/humidity sensors 4 meets a specific temperature threshold condition, sending the monitored temperature information to the control unit 1. This is not limited in embodiments of this application.

The processing module in the control unit 1 determines lowest temperature T1 and highest temperature T2 by using the temperature information. The lowest temperature T1 is a smallest value in a plurality of temperature values obtained by using the plurality of temperature/humidity sensors 4, and the highest temperature T2 is a greatest value in the plurality of temperature values obtained by using the plurality of temperature/humidity sensors 4.

The storage module stores a temperature control parameter. Specifically, the temperature control parameter includes a normal-temperature threshold T3 and a high-temperature threshold T4. For example, a value of the normal-temperature threshold T3 is 27° C., and a value of the high-temperature threshold T4 is 40° C. It may be understood that the values of T3 and T4 may alternatively be other values, and specific values are related to factors such as a running environment or a temperature control objective. This is not limited in this application.

Alternatively, the temperature control parameter may be received by using the information receiving module, or the temperature control parameter is input and configured by using a separate input module. This is not limited in embodiments of this application.

Step 502: Output a control signal, and control an opening degree of a proportional solenoid valve in the liquid cooling heat dissipation system.

Specifically, the processing module outputs the control signal to the proportional solenoid valve 6 by using the signal output module based on the temperature control parameter, the determined lowest temperature T1, and the determined highest temperature T2.

Optionally, the method further includes step 501a: The control unit 1 obtains current opening degree information of the proportional solenoid valve. The storage module further stores a correspondence between the temperature information and a target opening degree of the proportional solenoid valve; in other words, the storage module further stores a correspondence between the target opening degree of the proportional solenoid valve and both the lowest temperature T1 and the highest temperature T2. For example, mapping relationship information in the following Table 1 is stored.

TABLE 1

| Correspondence between temperature information and target opening degree information of a proportional solenoid valve | |
|---|---|
| Temperature information | Target opening degree of a regulating valve |
| T2 ≤ T3 | 0 |
| T1 ≤ T3 ≤ T2 ≤ T4 | 20% |
| T3 ≤ T1 ≤ T2 ≤ T4 | 50% |
| T3 ≤ T1 ≤ T4 ≤ T2 | 80% |
| T3 ≤ T4 ≤ T1 ≤ T2 | 100% |

Correspondingly, based on step 501 and step 501a, further, step 502 of outputting a control signal and controlling an opening degree of a proportional solenoid valve in the liquid cooling heat dissipation system is specifically implemented by using the following process: The processing module obtains target opening degree information of the proportional solenoid valve based on the temperature information and by using Table 1, calculates, based on the target opening degree information of the proportional solenoid valve and obtained current opening degree information of the proportional solenoid valve, an opening degree value to be adjusted to, and outputs, to the proportional solenoid valve by using the signal output module, a control signal corresponding to the opening degree value to be adjusted to.

A heat dissipation control method is separately provided in Embodiment 4 to Embodiment 7 based on Embodiment 3.

Embodiment 4 provides a heat dissipation control method based on Embodiment 3.

Before step 501, an air/liquid heat exchanger 5 is started. In this case, a proportional solenoid valve 6 is opened and has an initial opening degree, and coolant flows from an inlet 7 to the air/liquid heat exchanger 5 and flows out of an outlet 8. This step is optional.

Figure 6A:
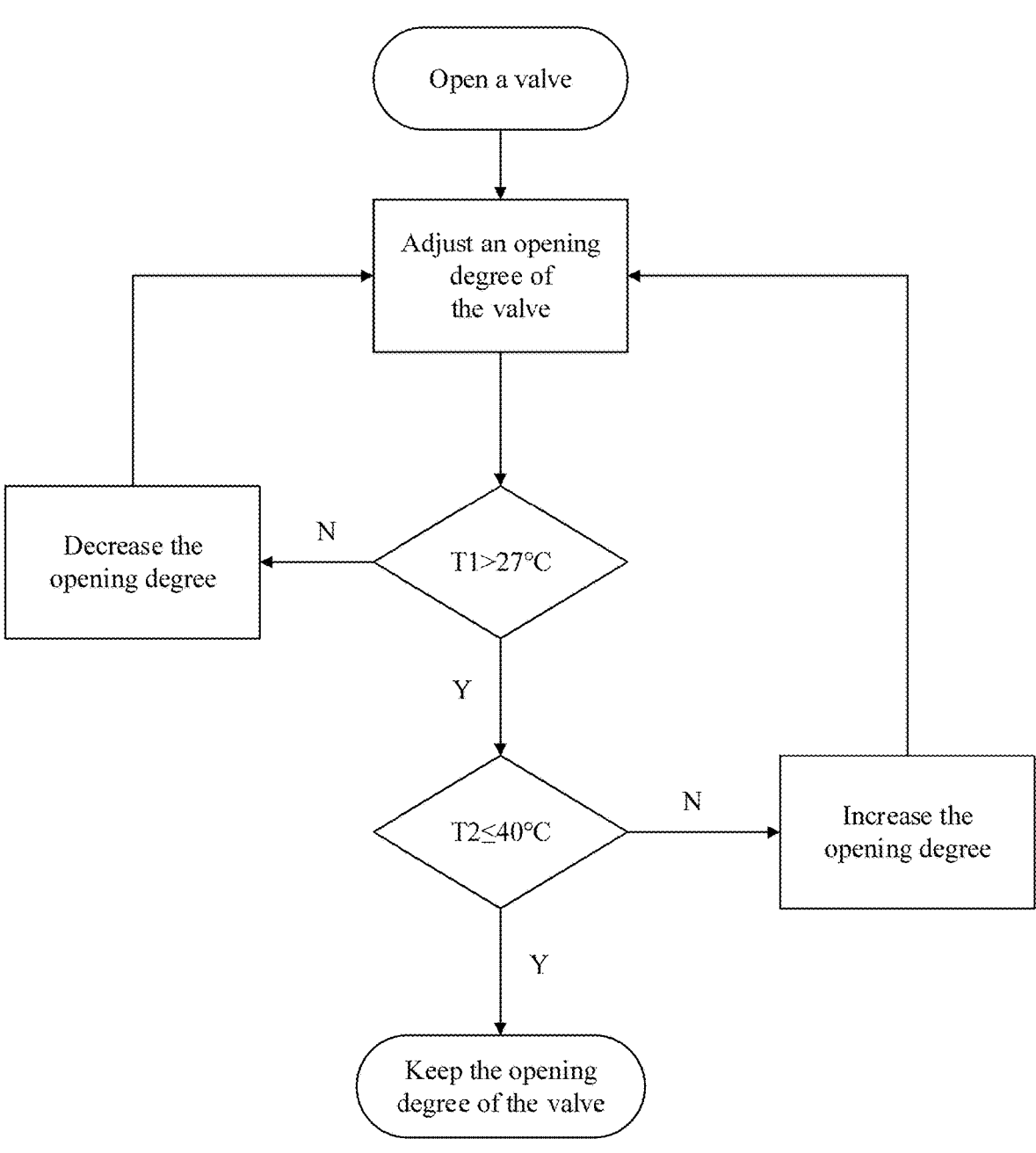
FIG. 6A is a block diagram of control logic of a heat dissipation control method according to Embodiment 3 of this application.
Figure 6B:
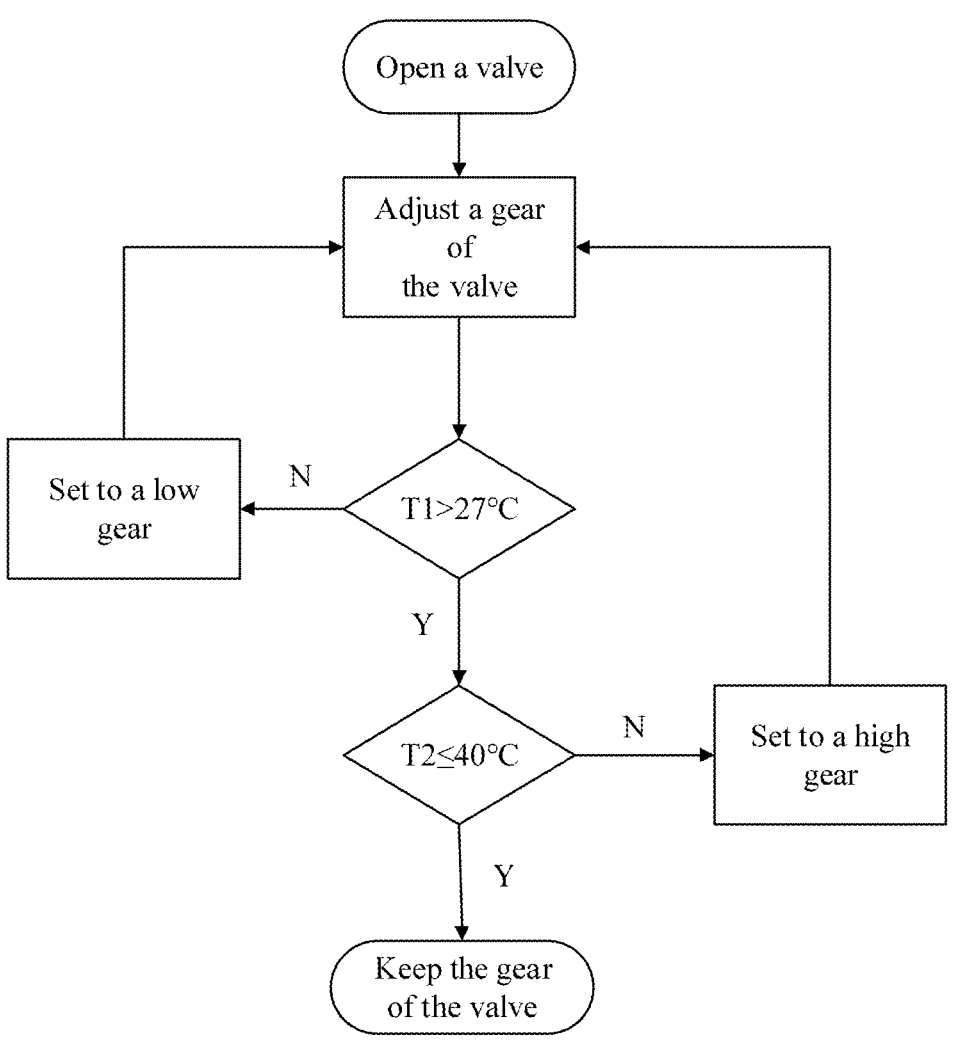
FIG. 6B is a block diagram of control logic of another heat dissipation control method according to Embodiment 3 of this application.

In this embodiment, a specific implementation of step 502 is shown in FIG. 6A and FIG. 6B.

If T1 is lower than or equal to T3 (27° C.), the proportional solenoid valve is controlled to decrease the opening degree, or the proportional solenoid valve is controlled to switch to a low gear. It may be understood that, that the proportional solenoid valve decreases the opening degree or switches to the low gear includes a case in which the valve is closed. Switching to the low gear may be: switching to a gear that is one gear lower than a current gear; may be: switching to a gear that is X gears lower than a current gear, where X is a positive integer; or may be: directly switching to a lowest gear. This is not limited in this application. In this case, because T1 is less than 27° C., temperature of a partial area in a cabinet is relatively low, and is close to or even lower than dew point temperature (in this embodiment, an example dew point temperature value is 20° C.). To avoid or reduce condensation, a flow amount of coolant flowing to the air/liquid heat exchanger needs to be reduced. It may be understood that this process may be performed for a plurality of times until a value of T1 is greater than or equal to T3 (27° C.).

Optionally, in the foregoing control method, in an adjustment process, temperature overshoot does not exceed 3° C. Specifically, response time and reaction time are required for any control. For example, when it is sensed that current temperature is excessively low and the valve needs to be turned down, time is required in a process from collecting a temperature signal to delivering a valve control signal to performing adjustment by the valve to temperature changing, and a target value can be reached immediately after one adjustment. For example, current temperature is 22° C. and a target is 27° C. After an adjustment command is delivered, the valve is turned down, the temperature is adjusted to 23° C., and adjustment still needs to be performed, and the opening degree of the valve continues to be adjusted. The temperature can be adjusted to a stable status after a plurality of such processes. The foregoing process usually takes several minutes to dozens of minutes, and it is also difficult to directly reach the target value. Therefore, a fluctuation margin is designed, for example, the target value±3° C. (temperature overshoot does not exceed 3° C.). It is considered that the target has been reached provided that an obtained temperature value fluctuates in this range, and no further adjustment is required.

If T2 is greater than T4 (40° C.), the proportional solenoid valve is controlled to increase the opening degree, or the proportional solenoid valve is controlled to switch to a high gear. It may be understood that, that the proportional solenoid valve increases the opening degree or switches to the high gear includes a case in which the valve is fully opened. Switching to the high gear may be: switching to a gear that is one gear greater than a current gear; may be: switching to a gear that is Y gears greater than a current gear, where Y is a positive integer; or may be: directly switching to a highest gear. This is not limited in this application. In this case, because T2 is greater than 40° C., temperature of a partial area in the cabinet is relatively high, and heat dissipation needs to be accelerated, and therefore, a flow amount of coolant flowing to the air/liquid heat exchanger needs to be increased. It may be understood that this process may be performed for a plurality of times until a value of T2 is less than or equal to T4 (40° C.).

If T1 is greater than T3 (27° C.) and T2 is less than T4 (40° C.), the proportional solenoid valve is controlled to keep the current opening degree or the proportional solenoid valve is controlled to switch to a medium gear, or a control signal is not output and the proportional solenoid valve is not adjusted. In this case, because the temperature value in the cabinet is in a moderate temperature range, there is neither a low-temperature area in which condensation occurs nor a high-temperature area that affects working stability of a communication device in the cabinet. Therefore, current cooling strength can be kept.

If it is detected that T1 is less than T3 (27° C.) and T2 is greater than T4 (40° C.), an alarm signal is output and the proportional solenoid valve is not adjusted. In this case, the temperature information includes a plurality of temperature values with a relatively large deviation, and it is determined that some temperature/humidity sensors are faulty, the alarm signal is sent, and a prompt is sent to a user in a timely manner.

In the foregoing control method, in a specific control process, the normal-temperature threshold T3 may also be replaced with dew point temperature Td or dew point temperature Td±N (where any value in a range 1° C. to 5° C. may be selected as N based on an actual situation). In other words, different control is separately performed by determining values of T1 and Td or Td±N and values of T2 and T4. Similar effects are achieved.

Optionally, if the control unit 1 detects that the temperature/humidity sensor 4 or the dew point meter that is disposed outside the equipment cabinet 3 to monitor the dew point temperature is faulty, the control unit 1 sends the alarm signal to prompt the user in a timely manner.

Optionally, when the control unit 1 controls the proportional solenoid valve 6, the method further includes: obtaining current opening degree information of the proportional solenoid valve 6. For example, the current temperature is 22° C., a target is 27° C., and the current opening degree of the valve is 50%. After the adjustment command is issued, the valve is turned down to 48%; and then the temperature is adjusted to 24° C., and the opening degree of the valve continues to be adjusted. Similarly, adjustment is completed after a plurality of such processes are performed.

Optionally, when the control unit 1 controls the proportional solenoid valve 6, temperature control stability time is within 10 minutes and temperature fluctuation is within ±1° C. Specifically, when the control unit 1 controls the proportional solenoid valve 6, after a single control, a state in which the temperature control stability time is within 10 minutes and the temperature fluctuation is within ±1° C. is used as a stable state reached after the temperature is controlled. Based on a temperature value in the temperature control stable state, whether to perform another control is determined. For example, the current temperature is 22° C., a target is 27° C., and the current opening degree of the valve is 50%. After the adjustment command is issued, the valve is turned down to 48%, and then the temperature value is monitored. When the temperature value is within 24° C.±1° C. within 10 minutes, it is considered that the current temperature is adjusted to 24° C. The opening degree of the valve still needs to be adjusted, and adjustment is completed after a plurality of such processes are performed.

In the foregoing heat dissipation control method, temperature of the equipment cabinet can be dynamically adjusted based on the temperature value in the equipment cabinet, to avoid or reduce a condensation phenomenon. Control logic is brief, and stability of a control process is facilitated.

Embodiment 5 provides a heat dissipation control method based on Embodiment 4.

In the method, the control unit 1 further obtains humidity information. The humidity information includes a humidity value monitored by each temperature/humidity sensor 4. Alternatively, the humidity information includes air supply humidity RH, and the air supply humidity RH is a maximum value of humidity measured by six temperature/humidity sensors.

A specific manner of obtaining the humidity information is similar to a manner of obtaining the temperature information, and details are not described herein again.

Further, the storage module further includes a humidity control parameter, and the humidity control parameter includes a high-humidity threshold RH2. For example, the high-humidity threshold RH2 is 85%. It may be understood that a value of RH2 may alternatively be another value, and a specific value is related to a running environment, a temperature control objective, or the like. This is not limited in this application.

A manner of obtaining the humidity control parameter is similar to a manner of obtaining the temperature control parameter, and details are not described herein.

Figure 7A:
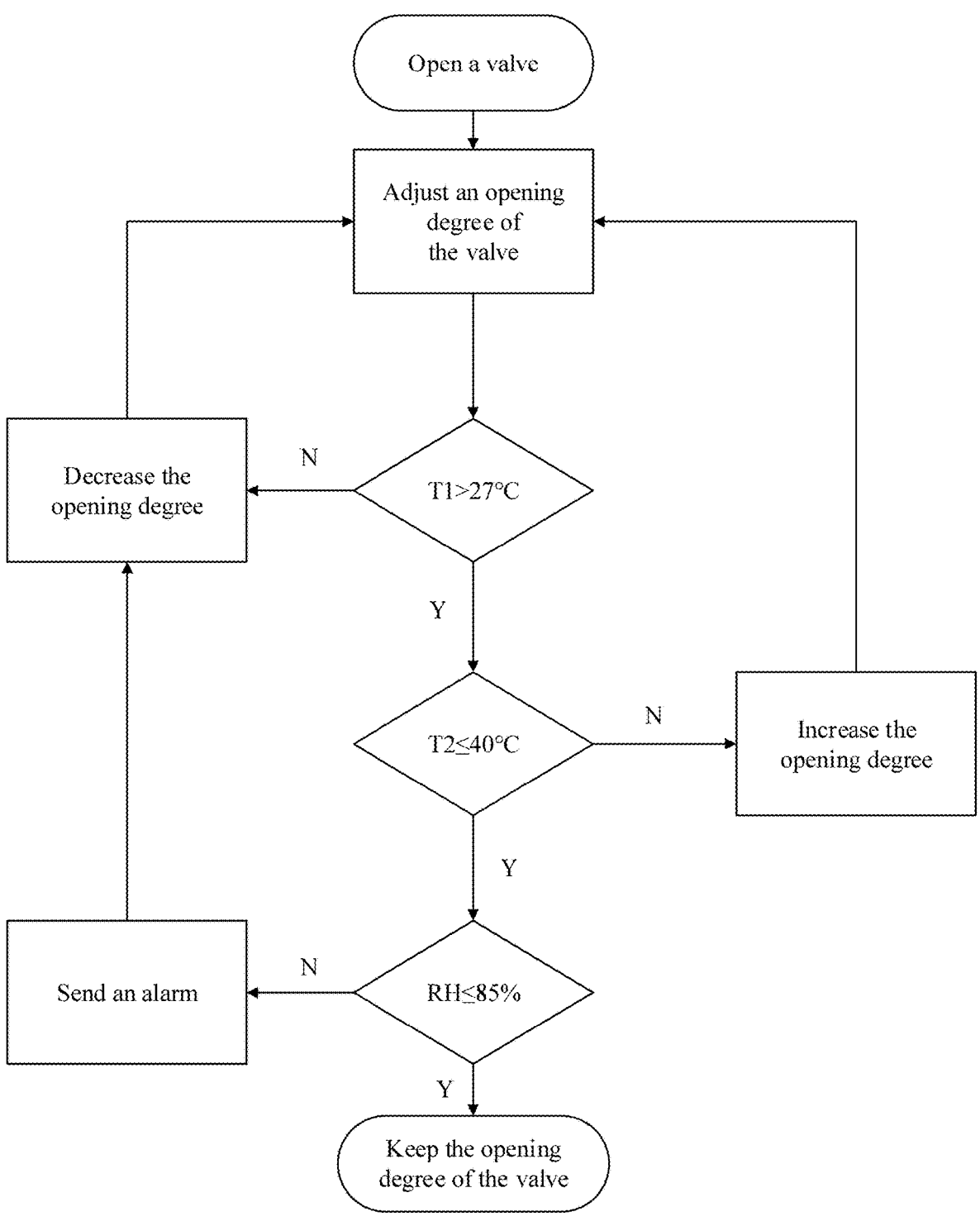
FIG. 7A is a block diagram of control logic of a heat dissipation control method according to Embodiment 4 of this application.
Figure 7B:
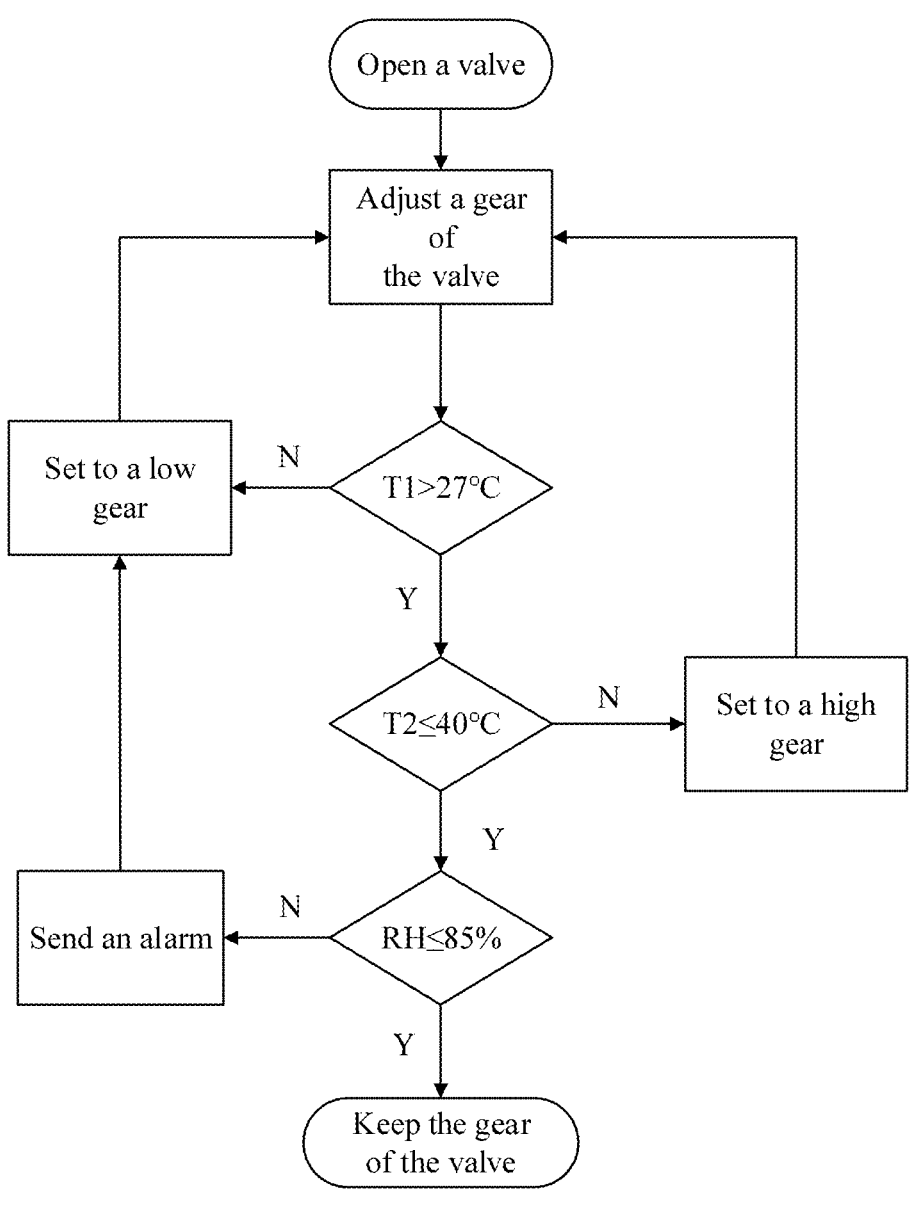
FIG. 7B is a block diagram of control logic of another heat dissipation control method according to Embodiment 4 of this application.

In this embodiment, a specific implementation of step 502 is shown in FIG. 7A and FIG. 7B.

When T1 is greater than T3 (27° C.) and T2 is less than or equal to T4 (40° C.), the humidity information continues to be determined as follows:

If RH is less than or equal to RH2 (85%), the proportional solenoid valve is controlled to keep the current opening degree or the proportional solenoid valve is controlled to switch to a medium gear, or a control signal is not output and the proportional solenoid valve is not adjusted. In this case, because the temperature value in the cabinet is in a moderate temperature range, there is neither a low-temperature area in which condensation occurs nor a high-temperature area that affects working stability of a communication device in the cabinet, and air humidity does not exceed a warning value. Therefore, current cooling strength can be kept.

If RH is greater than RH2 (85%), an alarm signal is sent, and the user is prompted that the current air humidity is high and the air humidity exceeds the warning value. At the same time, the proportional solenoid valve is controlled to decrease the opening degree or the proportional solenoid valve is controlled to switch to a low gear. In this case, the air humidity in the cabinet is very high, cooling strength needs to be reduced and the air humidity is reduced first. It may be understood that, a faster flow rate/a larger flow amount of cooling liquid flowing to an air/liquid heat exchanger leads to lower temperature of the air/liquid heat exchanger, and lower temperature of an air flow blown to the cabinet leads to corresponding higher humidity of the air flow. On the contrary, a slower flow rate/a smaller flow amount of cooling liquid flowing to the air/liquid heat exchanger leads to higher temperature of the air/liquid heat exchanger, and higher temperature of the air flow blown to the cabinet leads to corresponding lower humidity of the air flow. Therefore, when humidity of an air supply flow needs to be controlled to be reduced, the proportional solenoid valve needs to be controlled to decrease the opening degree or the proportional solenoid valve needs to be controlled to switch to a low gear, to reduce a flow amount of coolant flowing to the air/liquid heat exchanger.

Embodiment 6 provides still another heat dissipation control method based on Embodiment 5.

In the method, the humidity control parameter further includes a normal-humidity threshold RH1. For example, the normal-humidity threshold RH1 is 60%. It may be understood that a value of RH1 may alternatively be another value, and a specific value is related to a running environment, a temperature control objective, or the like. This is not limited in this application.

Figure 8A:
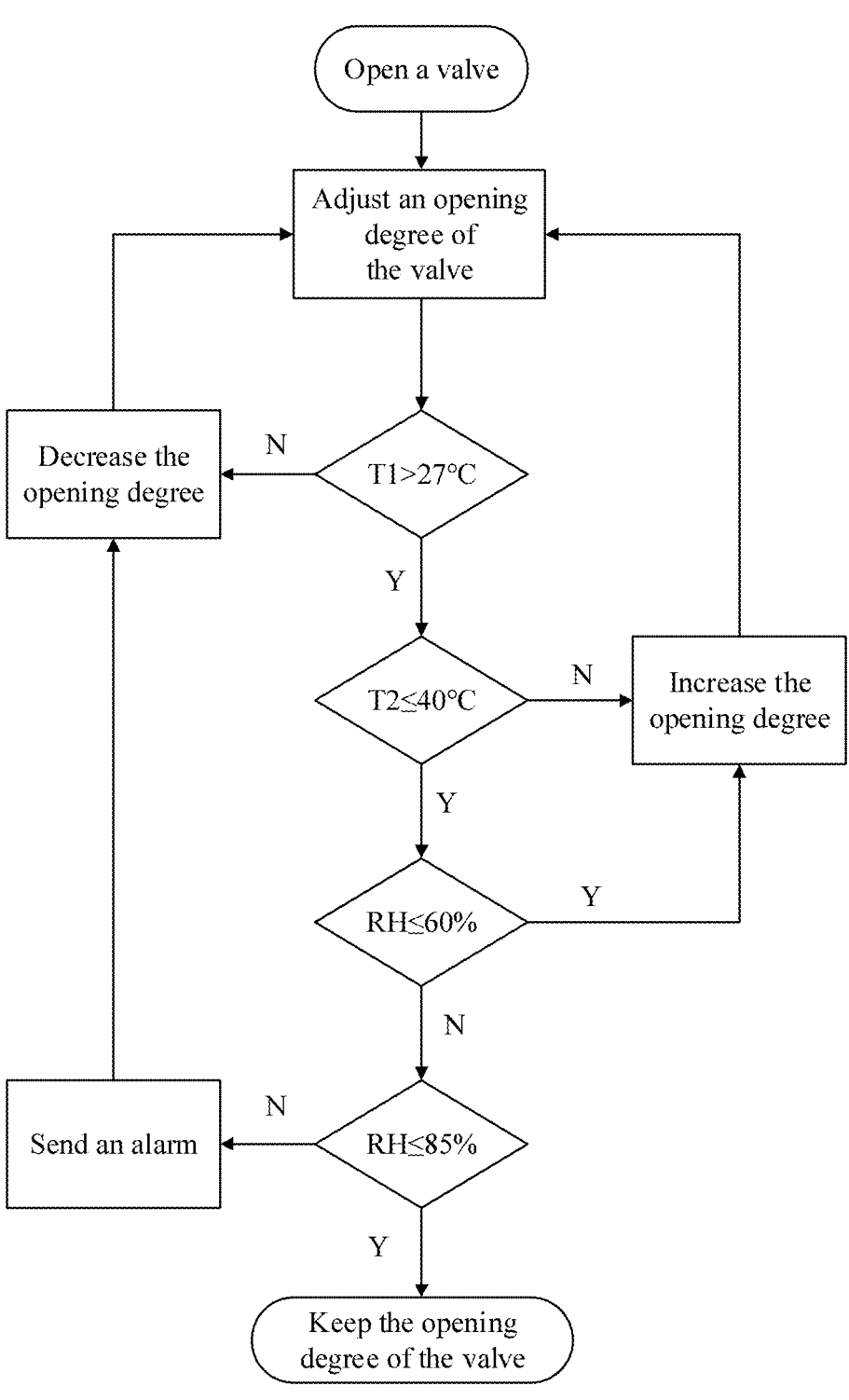
FIG. 8A is a block diagram of control logic of a heat dissipation control method according to Embodiment 5 of this application.
Figure 8B:
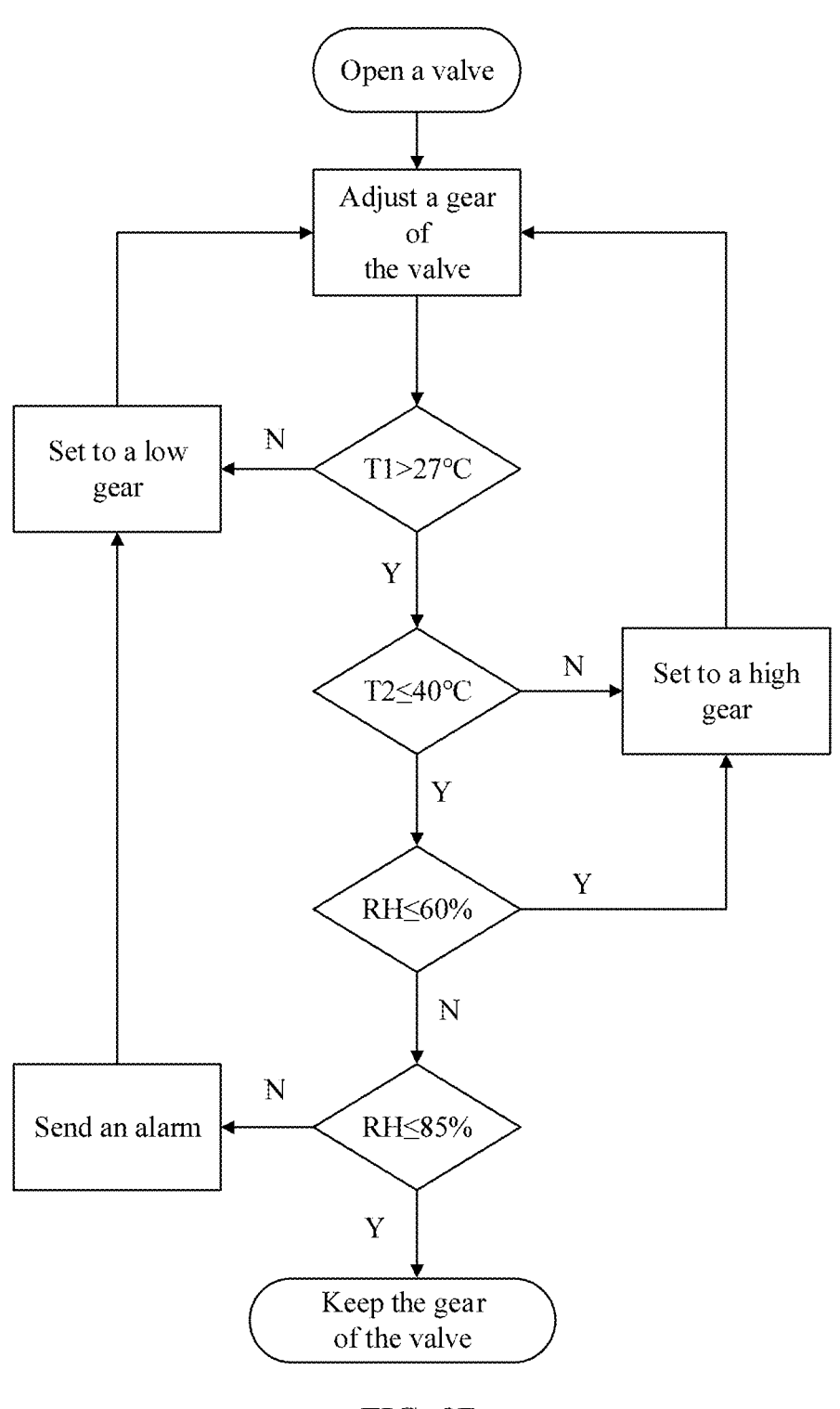
FIG. 8B is a block diagram of control logic of another heat dissipation control method according to Embodiment 5 of this application.

In this embodiment, a specific implementation of step 502 is shown in FIG. 8A and FIG. 8B.

When T1 is greater than T3 (27° C.) and T2 is less than or equal to T4 (40° C.), the humidity information continues to be determined as follows:

If RH is less than RH1 (60%), the proportional solenoid valve is controlled to increase the opening degree, or the proportional solenoid valve is controlled to switch to a high gear. In this case, the air humidity in the cabinet is not high, and cooling strength can be appropriately increased, to further dissipate heat for the cabinet.

If RH is greater than RH1 (60%) but does not exceed RH2 (85%), the proportional solenoid valve is controlled to keep the current opening degree or the proportional solenoid valve is controlled to switch to a medium gear, or a control signal is not output and the proportional solenoid valve is not adjusted.

If RH is greater than RH2 (85%), an alarm signal is sent, and the user is prompted that the current air humidity is high and the air humidity exceeds the warning value. At the same time, the proportional solenoid valve is controlled to decrease the opening degree or the proportional solenoid valve is controlled to switch to a low gear. In this case, the air humidity in the cabinet is very high, cooling strength needs to be reduced and the air humidity is reduced first.

Embodiment 7 provides still another heat dissipation control method based on Embodiment 4.

In the method, the humidity control information further includes a high-temperature alarm threshold T5. For example, a value of the high-temperature alarm threshold T5 is 43° C. It may be understood that the value of T5 may alternatively be another value, and a specific value is related to a running environment, a temperature control objective, or the like. This is not limited in this application.

Figure 9:
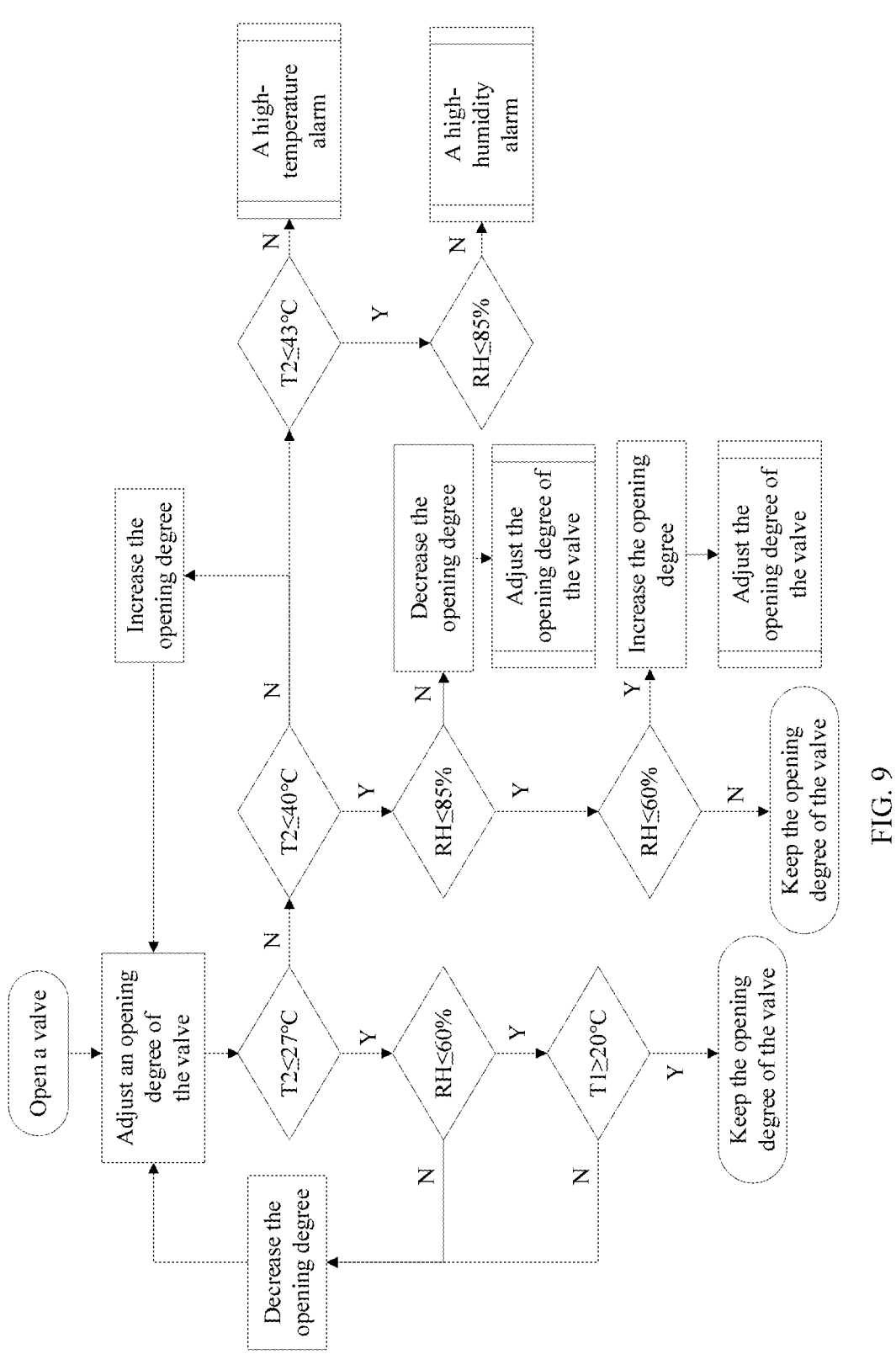
FIG. 9 is a block diagram of control logic of a heat dissipation control method according to Embodiment 6 of this application.

In this embodiment, a specific implementation of step 502 is shown in FIG. 9.

If T2 is less than T3 (27° C.) and RH is greater than RH1 (60%), the proportional solenoid valve is controlled to decrease the opening degree, or the proportional solenoid valve is controlled to switch to a low gear. In this case, because temperature in the cabinet is not high, air supply humidity is preferentially controlled, and air humidity in the cabinet is reduced. Therefore, in this case, the proportional solenoid valve is controlled to decrease the opening degree or the proportional solenoid valve is controlled to switch to the low gear, to reduce a flow amount of coolant flowing to the air/liquid heat exchanger.

If T2 is less than T3 (27° C.), RH is greater than RH1 (60%), and T1 is less than Td (20° C.), the proportional solenoid valve is controlled to decrease the opening degree, or the proportional solenoid valve is controlled to switch to a low gear. T1 is lower than Td (20° C.). In this case, temperature of a partial area in the cabinet is lower than dew point temperature 20° C. To avoid or reduce condensation, the flow amount of coolant flowing to the air/liquid heat exchanger needs to be reduced.

If T2 is less than T3 (27° C.), RH is less than RH1 (60%), and T1 is greater than Td (20° C.), the proportional solenoid valve is controlled to keep the current opening degree or the proportional solenoid valve is controlled to switch to a medium gear, or a control signal is not output and the proportional solenoid valve is not adjusted. In this case, because the temperature value in the cabinet is in a relatively low temperature range, there is neither a low-temperature area in which condensation occurs nor a high-temperature area that affects working stability of a communication device in the cabinet, and an air humidity value is not large. Therefore, current cooling strength can be kept.

If T2 is between T3 (27° C.) and T4 (40° C.) and RH is between RH1 (60%) and RH2 (85%), the proportional solenoid valve is controlled to keep the current opening degree or the proportional solenoid valve is controlled to switch to a medium gear, or a control signal is not output and the proportional solenoid valve is not adjusted. In this case, both temperature and humidity in the cabinet are within a safe range, and are in a relatively balanced state. Therefore, the heat dissipation system is controlled to keep current cooling strength.

If T2 between T3 (27° C.) and T4 (40° C.) and RH is less than RH1 (60%), the proportional solenoid valve is controlled to increase the opening degree, or the proportional solenoid valve is controlled to switch to a high gear. In this case, the humidity in the cabinet is relatively low. Therefore, the heat dissipation system may be controlled to increase the cooling strength, to further reduce the temperature in the cabinet.

If T2 between T3 (27° C.) and T4 (40° C.) and RH is greater than RH2 (85%), the proportional solenoid valve is controlled to decrease the opening degree, or the proportional solenoid valve is controlled to switch to a low gear. In this case, the humidity in the cabinet is very high. Therefore, the cooling strength of the heat dissipation system needs to be reduced, to reduce the humidity in the cabinet.

If T2 exceeds T4 (40° C.), the proportional solenoid valve is controlled to increase the opening degree, or the proportional solenoid valve is controlled to switch to a high gear. In this case, the temperature in the cabinet is relatively high. Therefore, the heat dissipation system may be controlled to increase the cooling strength, to further reduce the temperature in the cabinet. Further, if T2 exceeds T5 (43° C.), an alarm signal is sent, to prompt the user that the temperature in the cabinet is excessively high. In addition, if RH exceeds RH2 (85%), an alarm signal is sent, to prompt the user that air humidity in the cabinet is high and that the air humidity in the cabinet exceeds a warning value.

Based on the heat dissipation control method provided in Embodiment 7, a manner of controlling the proportional solenoid valve 6 by the control unit 1 is shown in Table 2.

TABLE 2

| Command sequence number | Temperature and humidity range | | Action target of a valve | Action of a valve and result prediction | Associated instruction |
|---|---|---|---|---|---|
| | | | | Control logic relationship of a proportional solenoid valve | |
| A | T2 ≤ 27° C. RH > 60% | | RH = 60% ± 5% | Turn down the valve, increase temperature, and reduce humidity T2 > 40° C. | Jump to E |
| | | | | Turn down the valve, increase temperature, and reduce humidity 27° C. < T2 ≤ 40° C. | Jump to D |
| | | | | Turn down the valve, increase temperature, and reduce humidity T2 ≤ 27° C. | Jump to B or C |
| B | T2 ≤ 27° C. T1 ≥ Td RH ≤ 60% | | Keep the valve | No action, T2 ≤ 27° C. | End |
| C | T2 ≤ 27° C. T1 < Td RH ≤ 60% | | T1 = Td ± 1° C. | Turn down the valve, increase temperature, and reduce humidity T2 > 40° C. | Jump to E |
| | | | | Turn down the valve, increase temperature, and reduce humidity 27° C. < T2 ≤ 40° C. | Jump to D |
| | | | | Turn down the valve, increase temperature, and reduce humidity T2 ≤ 27° C. | Jump to B or C |
| D | 27° C. < T2 ≤ 40° C. | RH > 85% | RH = 85% – 5% | Turn down the valve T2 > 40° C. | Jump to E |
| | | | | Turn up the valve 27° C. < T2 ≤ 40° C. | Keep D |
| | | 60% < RH ≤ 85% | | Turn up the valve 27° C. < T2 ≤ 40° C. | Keep D |
| | | | | Turn up the valve T2 ≤ 27° C. | Jump to A |
| | | RH < 60% | RH = 60% ± 5% | Turn up the valve 27° C. < T2 ≤ 40° C. | Keep D |
| | | | | Turn up the valve T2 ≤ 27° C. | Jump to B or C |

TABLE 2-continued

| | | | Control logic relationship of a proportional solenoid valve | |
| Command sequence number | Temperature and humidity range | | Action target of a valve | Action of a valve and result prediction | Associated instruction |
| --- | --- | --- | --- | --- | --- |
| E | T2 > 40° C. | RH > 85% | T2 = 27° C. | Turn up the valve T2 > 40° C. | Keep E |
| | | | | Turn up the valve 27° C. < T2 ≤ 40° C. | Jump to D |
| | | | | Turn up the valve T2 ≤ 27° C. | Jump to A |
| | | RH ≤ 85% | | Turn up the valve T2 > 40° C. | After the valve is adjusted to an opening degree of 100%, a high-temperature alarm is sent after a delay |
| | | | | Turn up the valve 27° C. < T2 ≤ 40° C. and RH > 85% | Jump to D |
| | | | | Turn up the valve 27° C. < T2 ≤ 40° C. and RH ≤ 85% | Jump to D |
| | | | | Turn up the valve T2 ≤ 27° C. | Jump to A |

When the control unit 1 controls the proportional solenoid valve 6, different control instructions correspond to different obtained current temperature and humidity ranges in the cabinet. In addition, control logic of the heat dissipation control system further includes: determining an action target of the valve for each control instruction, making corresponding prediction for a control result, and associating the prediction with different corresponding control instructions.

For example, for a control instruction A, a current temperature and humidity range corresponding to the control instruction A is T2≤27° C. and RH>60%. In this case, a control target is set to RH=60%±5%, and the control instruction A is used to turn down a valve of the solenoid valve and reduce humidity in the cabinet. When the solenoid valve responds to adjustment of the control instruction A, a corresponding temperature value and a corresponding humidity value in the cabinet change. When it is predicted that the temperature in the cabinet changes to T2>40° C. after adjustment, an associated instruction is an instruction E; in other words, the valve of the solenoid valve is turned up.

A current temperature range corresponding to the control instruction E is T2>40° C. In this case, a control target is set to T2=27° C., and the control instruction E is used to turn up the valve of the solenoid valve and reduce temperature in the cabinet. When the solenoid valve responds to adjustment of the control instruction E, a corresponding temperature value and a corresponding humidity value in the cabinet change. When it is predicted that the temperature in the cabinet is still T2>40° C. after adjustment, an associated instruction is keeping the instruction E; in other words, the valve of the solenoid valve continues to be turned up.

Optionally, in the foregoing control method, when the control unit 1 controls the proportional solenoid valve 6, temperature overshoot does not exceed 3° C. and humidity overshoot does not exceed 10%. In other words, when a temperature value obtained after adjustment is a target value±3° C., it is considered that the temperature has reached the control target. When a humidity value obtained after adjustment is the target value±10%, it is considered that the humidity has reached the control target, and no further adjustment is required.

Optionally, in the foregoing control method, in an adjustment process, temperature control stability time is within 10 minutes, temperature fluctuation is within ±1° C., and humidity fluctuation is within ±5%. Specifically, when the control unit 1 controls the proportional solenoid valve 6, after a single control, a state in which the temperature fluctuate is within ±1° C. and the humidity fluctuation is within ±5% within 10 minutes is used as a stable state after the temperature is controlled. Based on a temperature value in the temperature control stable state, whether to perform another control is determined.

This application further provides a computer-readable storage medium. The computer-readable storage medium stores instructions. When the instructions are run, steps in the control method provided in the foregoing embodiment may be performed.

This application further provides a computer program product including instructions. When the computer program product is run, steps in the control method provided in the foregoing embodiment may be performed.

This application further provides a chip, used as the control unit 1 in the foregoing embodiment. The chip includes a processing module and a storage module. The processing module is configured to read and run a computer program stored in the storage module, to perform corresponding operations and/or procedures of the heat dissipation control method provided in this application. The storage module is connected to the processing module by using a circuit or a wire, and the processing module is configured to read and execute a computer program in the storage module. Further, optionally, the chip further includes a communication interface, and the processor is connected to the communication interface. The communication interface is configured to receive to-be-processed data and/or information, and the processor obtains the data and/or information from the communication interface, and processes the data and/or information. The communication interface may be an input/output interface.

In this application, the terms "include", "comprise" and any other variants mean to cover the non-exclusive inclusion, for example, a process, method, system, product, or device that includes a list of steps or units is not necessarily limited to those steps or units that are clearly listed, but may include other steps or units not expressly listed or inherent to such a process, method, product, or device.

A person of ordinary skill in the art may be aware that units and algorithm steps in the examples described with reference to embodiments disclosed in this specification can be implemented by electronic hardware or a combination of computer software and electronic hardware. Whether the functions are performed by hardware or software depends on particular applications and design constraints of the technical solutions. A person skilled in the art may use a different method to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the method embodiments. Details are not described herein again.

In the several embodiments provided in this application, it should be understood that the disclosed system, apparatus, and method may be implemented in other manners. For example, the described apparatus embodiments are merely examples. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electrical, mechanical, or another form.

The units described as separate parts may or may not be physically separate, and parts displayed as units may or may not be physical units, may be located in one position, or may be distributed on a plurality of network units. Apart or all of the units may be selected based on actual requirements to achieve the objectives of the solutions of the embodiments.

In addition, functional units in embodiments of this application may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of this application essentially, or the part contributing to the conventional technology, or a part of the technical solutions may be implemented in a form of a software product. The computer software product is stored in a storage medium, and includes several instructions for instructing a computer device (which may be a personal computer, a server, a network device, or the like) to perform all or a part of the steps of the methods described in embodiments of this application. The foregoing storage medium includes any medium that can store program code, such as a USB flash drive, a removable hard disk, a read-only memory (Read-Only Memory, ROM), a random access memory (Random Access Memory, RAM), a magnetic disk, or an optical disc.

In addition, the term "and/or" in this application describes only an association relationship for describing associated objects and indicates that three relationships may exist. For example, A and/or B may indicate the following three cases: Only A exists, both A and B exist, and only B exists. In addition, the character "/" in this specification generally indicates an "or" relationship between the associated objects. The term "at least one" in this application may represent "one" and "two or more". For example, at least one of A, B, and C may indicate the following seven cases: Only A exists, only B exists, only C exists, both A and B exist, both A and C exist, both C and B exist, and A, B, and C exist.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A heat dissipation control method for a liquid cooling heat dissipation system, the heat dissipation control method comprising:

obtaining temperature information of different locations in a heat source box from at least one temperature sensor, wherein the temperature information comprises a plurality of temperature values;

determining a lowest temperature value of the temperature values and a highest temperature value of the temperature values;

obtaining a temperature control parameter comprising a normal-temperature threshold and a high-temperature threshold;

obtaining a humidity control parameter comprising a high-humidity threshold and a normal-humidity threshold;

obtaining humidity information from at least one humidity sensor, wherein the humidity information comprises a plurality of humidity values;

determining a highest humidity value of the humidity values; and controlling an opening degree of a flow regulating valve in the liquid cooling heat dissipation system, wherein the controlling comprises performing a control operation to maintain a current opening degree of the flow regulating valve in response to detection that the lowest temperature value is greater than the normal-temperature threshold, the highest temperature value is less than or equal to the high-temperature threshold, and the highest humidity value is less than or equal to the high-humidity threshold.

2. The heat dissipation control method of claim 1, wherein controlling the opening degree comprises performing the control operation to decrease the opening degree in response to detection that the lowest temperature value is less than or equal to the normal-temperature threshold.

3. The heat dissipation control method of claim 1, wherein the temperature control parameter further comprises a dew point temperature value, wherein controlling the opening degree comprises performing the control operation to decrease the opening degree in response to detection that the lowest temperature value is less than or equal to a first value corresponding to a sum of the dew point temperature value and N, and wherein N is a preset value.

4. The heat dissipation control method of claim 1, wherein the temperature control parameter further comprises a dew point temperature value, wherein controlling the opening degree comprises performing the control operation to maintain the current opening degree in response to detection that the highest temperature value is less than or equal to the high-temperature threshold and the lowest temperature value is greater than a sum of the dew point temperature value and N and wherein N is a preset value.

5. The heat dissipation control method of claim 1, wherein the at least one humidity sensor is in the heat source box.

6. The heat dissipation control method of claim 1, wherein the flow regulating valve is a proportional solenoid valve.

7. The heat dissipation control method of claim 1, wherein controlling the opening degree comprises performing the control operation to increase the opening degree in response to detection that the lowest temperature value is greater than the normal-temperature threshold, the highest temperature value is less than or equal to the high-temperature threshold, and the highest humidity value is less than or equal to the normal-humidity threshold.

8. The heat dissipation control method of claim 1, wherein the temperature control parameter further comprises a dew point temperature value, and wherein controlling the opening degree comprises:

performing the control operation to maintain the current opening degree in response to detection that the lowest temperature value is greater than a sum of the dew point temperature value and N, the highest temperature value is less than or equal to the normal-temperature threshold, and the highest humidity value is less than or equal to the high-humidity threshold, wherein N is a preset value;

performing the control operation to increase the opening degree in response to detection that the lowest temperature value is greater than the sum, the highest temperature value is greater than the normal-temperature threshold and less than or equal to the high-temperature threshold, and the highest humidity value is less than or equal to the normal-humidity threshold; or performing the control operation to maintain the current opening degree in response to detection that the lowest temperature value is greater than the sum, the highest temperature value is greater than the normal-temperature threshold and less than or equal to the high-temperature threshold, and the highest humidity value is greater than the normal-humidity threshold and less than or equal to the high-humidity threshold.

9. The heat dissipation control method of claim 1, wherein the temperature control parameter further comprises an alarm temperature threshold, and wherein the heat dissipation control method further comprises sending an alarm signal when the highest temperature value is greater than or equal to the alarm temperature threshold or the highest humidity value is greater than or equal to the high-humidity threshold.

10. The heat dissipation control method of claim 1, wherein controlling the opening degree comprises performing the control operation to increase the opening degree in response to detection that the highest temperature value is greater than the high-temperature threshold.

11. The heat dissipation control method of claim 1, wherein controlling the opening degree comprises performing the control operation to decrease the opening degree in response to detection that the lowest temperature value is greater than the normal-temperature threshold, the highest temperature value is less than or equal to the high-temperature threshold, and the highest humidity value is greater than the high-humidity threshold.

12. The heat dissipation control method of claim 1, wherein controlling the opening degree comprises performing the control operation to maintain the current opening degree in response to detection that the lowest temperature value is greater than the normal-temperature threshold, the highest temperature value is less than or equal to the high-temperature threshold, and the highest humidity value is greater than the normal-humidity threshold and less than or equal to the high-humidity threshold.

13. The heat dissipation control method of claim 1, wherein the humidity information comprises air supply humidity value.

14. The heat dissipation control method of claim 1, wherein the temperature control parameter further comprises a dew point temperature value, and wherein the dew point temperature value comprises a preset value.

15. The heat dissipation control method of claim 1, wherein the temperature control parameter further comprises a dew point temperature value, and wherein the dew point temperature value comprises a value of an external dew point collecting system.

16. The heat dissipation control method of claim 1, wherein the temperature control parameter further comprises a dew point temperature value, and wherein the dew point temperature value comprises an adjustable parameter value.

17. The heat dissipation control method of claim 9, further comprising prompting, based on the alarm signal, a user to check a temperature sensor or a humidity sensor in the liquid cooling heat dissipation system.

18. The heat dissipation control method of claim 9, wherein the alarm signal indicates that a temperature sensor or a humidity sensor is faulty.

19. A chip system, comprising:

a memory configured to store program instructions; and a processor coupled to the memory and configured to execute the program instructions to cause the chip system to:

obtain, from at least one temperature sensor in a liquid cooling heat dissipation system, temperature information of different locations in a heat source box of the liquid cooling heat dissipation system, wherein the temperature information comprises a plurality of temperature values;

determine a lowest temperature value of the temperature values and a highest temperature value of the temperature values;

obtain a temperature control parameter comprising a normal-temperature threshold and a high-temperature threshold;

obtain a humidity control parameter comprising a high-humidity threshold;

obtain humidity information from at least one humidity sensor, wherein the humidity information comprises a plurality of humidity values;

determine a highest humidity value of the humidity values; and control an opening degree of a flow regulating valve in the liquid cooling heat dissipation system, wherein to control the opening degree, the program instructions further cause the chip system to perform a control operation to maintain a current opening degree of the flow regulating valve in response to detection that the lowest temperature value is greater than the normal-temperature threshold, the highest temperature value is less than or equal to the high-temperature threshold, and the highest humidity value is less than or equal to the high-humidity threshold.

\* \* \* \* \*